United States Patent
Bryant et al.

(10) Patent No.: US 6,200,843 B1
(45) Date of Patent: Mar. 13, 2001

(54) HIGH-VOLTAGE, HIGH PERFORMANCE FETS

(75) Inventors: Andres Bryant; Edward J. Nowak; Minh H. Tong, all of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/159,841

(22) Filed: Sep. 24, 1998

(51) Int. Cl.$^7$ .................................................. H01L 21/8238
(52) U.S. Cl. ........................ 438/216; 438/275; 438/299; 438/277; 438/286; 438/585; 438/595; 438/981
(58) Field of Search .................................. 438/275, 299, 438/277, 286, 585, 595, 981, 216

(56) References Cited

U.S. PATENT DOCUMENTS

| | | | |
|---|---|---|---|
| 3,576,477 | 4/1971 | Else Kooi | 317/235 |
| 3,943,542 | 3/1976 | Ho et al. | 357/23 |
| 4,236,167 | 11/1980 | Woods | 357/23 |
| 4,307,411 | 12/1981 | Carnes et al. | 357/23 |
| 4,384,301 | 5/1983 | Tasch, Jr. et al. | 357/23 |
| 4,952,825 | 8/1990 | Yoshida | 307/475 |
| 4,962,054 | 10/1990 | Shikata | 437/40 |
| 4,990,982 | 2/1991 | Omoto et al. | 357/23.8 |
| 5,146,291 | 9/1992 | Watabe et al. | 257/23.4 |
| 5,162,883 | 11/1992 | Fujihira | 257/139 |
| 5,314,834 | 5/1994 | Mazuré et al. | 437/43 |
| 5,495,116 | 2/1996 | Funakoshi et al. | 257/239 |
| 5,498,556 | 3/1996 | Hong et al. | 437/35 |
| 5,604,366 | 2/1997 | Lee | 257/316 |
| 5,621,236 | 4/1997 | Choi et al. | 257/389 |
| 5,684,317 | 11/1997 | Hwang | 257/316 |
| 5,918,133 | * 5/1999 | Grardner et al. | 438/299 |

* cited by examiner

*Primary Examiner*—David Nelms
*Assistant Examiner*—Quoc Hoang
(74) *Attorney, Agent, or Firm*—Pollock, Vande Sande & Amernick

(57) ABSTRACT

A method for forming a semiconductor device. A substrate is provided. A first electrically insulating layer is formed on the substrate. A second electrically insulating layer is formed on the first electrically insulating layer. Openings are formed through the second electrically insulating layer down to the level of the first electrically insulating layer. Spacers are formed on opposing sidewalls of the openings. The spacers on one of the opposing side walls of the openings are removed, thereby exposing portions of the first electrically insulating layer. Exposed portions of the first electrically insulating layer in the openings are removed, thereby exposing portions of the substrate. The spacers on another of the opposing sidewalls of the openings are removed, thereby exposing portions of the first electrically insulating layer. A third electrically insulating layer is formed in the openings over the exposed portions of the first electrically insulating layer and the exposed portions of the substrate.

4 Claims, 3 Drawing Sheets

HIGH-VOLTAGE, HIGH PERFORMANCE FETS

FIELD OF THE INVENTION

The present invention relates to the field of semiconductor devices. In particular, the present invention relates to field effect transistors (FETs) and particular FET structures especially suited for high voltage applications.

BACKGROUND OF THE INVENTION

In mixed voltage applications, often, an input/output (I/O) driver may need to be able to drive and receive voltages above a maximum chip operating voltage. For example, a 1.5 volt technology driver may need to drive and receive 3.3 volts. Since 3.3 volts is too high to be applied to 1.5 V I/O FETs directly, semiconductor chips that include the I/Os and the FETs typically utilize additional circuitry, device, and/or process solutions to avoid high-voltage stress across terminals of the FETs, and especially the thin gate oxide of the FETs.

One example of such solutions includes employing two types of FETs that have different gate oxide thicknesses. According to such a solution, one of the FETs is a "normal" FET, such as an NFET or a PFET, that includes thin oxide for low voltage applications. The other FET includes a thicker gate oxide such that the FETs can withstand a much higher voltage across the oxide. FIG. 1 illustrates a schematic of a mixed voltage driver and receiver.

Compared to a mixed voltage driver utilizing normal FETs, the thick oxide driver has a much denser layout. However, thick oxide devices have some disadvantages. For example, they have sub-optimal current drive capability due to high equivalent thick gate oxide and inherent higher threshold voltages. To obtain reasonable performances, the FETs typically need to be made large.

FIGS. 1a and 1b represent schematic diagrams of a known mixed voltage driver and receiver, respectively. These two device structures both suffer from the above-described problems. A thin oxide mixed voltage driver is disclosed in U.S. patent application Ser. No. 08/905,983, filed Aug. 5, 1997, for "Decoupling Scheme For Mixed-Voltage Integrated Circuits", to E. J. Nowak and M. H. Tong, assigned to the assignee of the present application, the entire disclosure of which is hereby incorporated by reference.

SUMMARY OF THE INVENTION

Aspects of the present invention provide a method for forming a semiconductor device. According to the method, a substrate is provided. A first electrically insulating layer is formed on the substrate. Then, a second electrically insulating layer is formed on the first electrically insulating layer. Next, openings are formed through the second electrically insulating layer down to the level of the first electrically insulating layer. Spacers are formed on opposing sidewalls of the openings. Subsequently, the spacers on one of the opposing side walls of the openings are removed, thereby exposing portions of the first electrically insulating layer. Exposed portions of the first electrically insulating layer in the openings are removed, thereby exposing portions of the substrate. The spacers on another of the opposing sidewalls of the openings are removed, thereby exposing portions of the first electrically insulating layer. A third electrically insulating layer is formed in the openings over the exposed portions of the first electrically insulating layer and the exposed portions of the substrate.

Other aspects of the present invention provide a semiconductor device. The semiconductor device includes a substantially planar substrate including a plurality of source regions. Also, the device includes a plurality of drain regions, one associated with one of the source regions. Each of the source regions is separated from the associated drain region by an associated substrate region. A plurality of regions of a dielectric material are arranged on the substrate. Each region of dielectric material overlaps one of the source regions, one of the associated drain regions, and one of the associate substrate regions. Each of the plurality of regions of dielectric material is thicker over the underlying drain region that over the underlying source region. The device also includes a plurality of gate conductor regions, one formed on each of the plurality of regions of dielectric material. An inside edge of the thicker portion of each region of dielectric material is self-aligned to an outside edge.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 2b represents a cross-sectional view of the structure corresponding to the schematic diagram illustrated in FIG. 2a;

FIGS. 3a and 3b represent schematic diagrams of applications that the present invention may be included in.

DETAILED DESCRIPTION OF THE INVENTION

The present invention overcomes the above-described problems and others by providing a gate structure that includes gate oxide having different portions having different thicknesses. In other words, the present invention includes an asymmetric gate oxide structure. The mixed gate oxide structure according to the present invention may be included in a FET structure to improve performance and still meet high voltage requirements. For example, the structure of the present invention may be included in an NFET device.

Figure 1A:
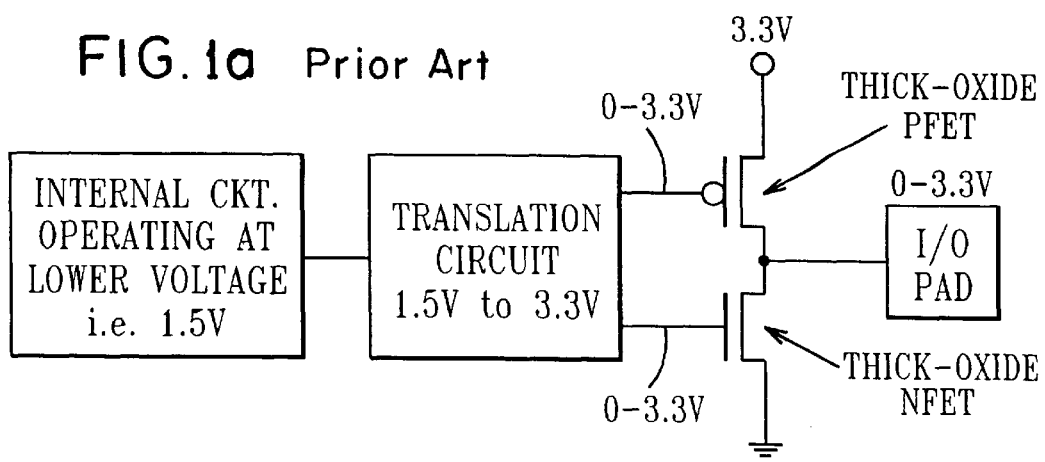
FIGS. 1a and 1b represent schematic diagrams of known circuit arrangements including mixed voltage drivers and receivers.
Figure 1B:
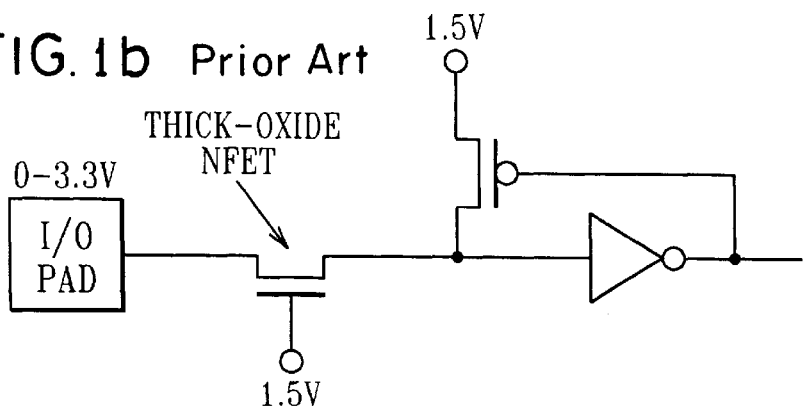
Figure 2A:
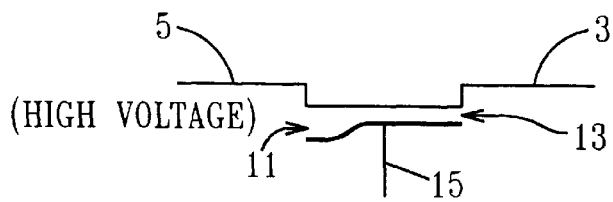
FIG. 2a represents a schematic diagram of an embodiment of a structure according to the present invention.

FIG. 2a illustrates a schematic diagram of an embodiment of the present invention. As illustrated in FIG. 2a , the thin oxide and thick oxide may be shared on the one NFET. The amount of relatively thicker oxide and the amount of relatively thinner oxide may differ, depending upon a variety of factors. Similarly, the thicknesses of the two oxide layers may vary.

The thick oxide may be from about 20% to about 30% thicker than the thin oxide. In absolute measurements, the thin oxide could have a thickness of from about 3 nm to about 5 nm, while the thick oxide could have a thickness of from about 7 nm to about 10 nm.

Figure 2B:
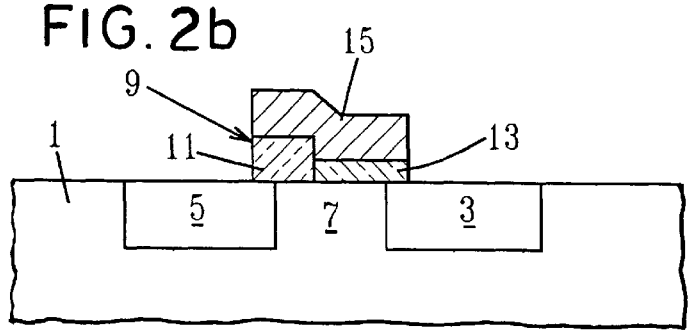

As can be seen in FIG. 2b, the structure of the present invention includes a substrate 1. Source regions 3 and drain regions 5 may be provided in the substrate 1. Each source region may be associated with a drain region. The source regions and drain regions may be separated from each other by an associated substrate region 7.

A plurality of regions of at least one dielectric material 9 are provided on the substrate, one associated with each associated source region 3 and drain region 5. According to the present invention, the regions of dielectric material 9 include a thicker portion 11 over one of the source region and the drain region associated with the regions of dielectric material. It follows that the regions of dielectric material also include a thinner portion 13 over the other of the source region and the drain region. Various embodiments of the present invention include regions of dielectric material that are thicker over the drain region than over the source region or thicker over the source region than over the drain region. The dielectric material may include at least one oxide.

According to some embodiments, an inside edge of the thicker portion of the regions of dielectric material are self aligned to an outside edge. Such self alignment techniques are well known. The methods of the present invention are described in greater detail below.

A device according to the present invention may also include a plurality of gate conductor regions 15. One gate conductor region 15 is formed in association with each region of dielectric material and the source region and the drain region associated with each region of dielectric material.

The upper surface of the gate conductor regions may not lie entirely in one plane as in the embodiment shown in FIG. 2b. However, the gate conductor regions may be substantially uniformly thick. According to some embodiments, the gate conductor regions may have substantially planar surfaces. There is no requirement that all of the gate conductor regions have the same upper surface configuration.

The extent that the gate conductor regions extend laterally may vary, depending upon the embodiment. For example, in some embodiments, the gate conductor region 15 may not extend beyond the underlying region of dielectric material 9. According to other embodiments, the gate conductor region may extend beyond the most lateral extent of the underlying region of dielectric material.

The present invention also includes methods for forming semiconductor device such as that described above. According to the methods, a substrate is provided. The substrate may be any typical substrate material, such as silicon.

A first electrically insulating layer 17 may be formed on the substrate 19. The first electrically insulating layer may include any electrically insulating material. A second layer 16 may be formed on the first electrically insulating layer. A variety of materials could be utilized in the second layer. One example of a material that could be utilized in the second layer is $Si_3N_4$. Electrically insulating materials for such applications are well known and will not be discussed any further herein. One of ordinary skill in the art would be able to determine a suitable electrically insulating material without undue experimentation.

After deposition of the second layer 16, openings may be formed in the second electrically insulating layer down to the upper surface of the first electrically insulating layer. In some cases, the openings may not extend as deep as the first electrically insulating layer or may extend deeper than the upper surface of the first electrically insulating layer.

As illustrated in FIGS. 4a–4d, after forming the openings 18 in the second layer 16, spacers 20 and 21 may be formed on opposing sidewalls 22 and 24 of the openings. While the spacers could be formed of a variety of materials, polycrystalline silicon is preferred. One of the spacers 21 in the embodiment illustrated in FIGS. 4a–4d, may be removed from one of the opposing sidewalls, thereby exposing portions of the first electrically insulating layer or whatever material lay at the bottom of the opening prior to forming the spacers.

After exposing the material lying at the bottom of the openings, the material may be removed, there by exposing underlying material. Typically, removal of the material underlying the opening exposes at least a portion of the substrate. In the embodiment illustrated in FIGS. 4a–4d, removal of spacer 21 exposed underlying electrically insulating layer 17. The exposed electrically insulating layer 17 was then removed to result in the structure shown in FIG. 4b.

Next, the other spacer may be removed from the opposing side wall. Similarly to removal of the first spacer, removal of the other spacer may expose portions of the first electrically insulating layer or any other material that lay at the bottom of the opening at the time of the formation of the spacers.

A third electrically insulating layer 26 of an electrically insulating material may then be deposited on the surfaces exposed by removal of the spacers and any underlying material. As described above, the third electrically insulating layer may be deposited on the exposed substrate and exposed first electrically insulating layer. The third electrically insulating layer forms the asymmetric dielectric layer described above.

An electrically conducting layer 28, the gate conductors, may be formed on at least portions of the third electrically conducting layer. At some point after its deposition, the electrically conducting layer may be planarized. Any known planarization technique may be utilized.

Additionally, the electrically conducting layer may be formed to extend laterally to any extent. According to one embodiment, the electrically conducting layer is formed to extend only so far as to be laterally coextensive with respect to the side walls of the openings, the formation of which is described above.

After creation of the electrically conducting layer, the second electrically insulating layer may then be removed. Subsequently, source regions and drain regions may then be formed in the substrate at least partially beneath the electrically conducting layer. After formation of the source and drain regions, electrically insulating material may be disposed, such as by depositing in some manner, adjacent side walls of the electrically conducting layer.

All of the steps described above may be carried out utilizing commonly known photolithographic, etching, doping, and implanting, among other, techniques.

One technique that may be utilized in the present invention is the "bird's beak" method. The bird's beak method is described in greater detail in "GIDL Induced Charge Injection For Characterization Of Plasma Edge Damage In CMOS Devices", IEEE International Conference On Microelectronic Test Structures Proceedings (1997), pp. 99–104, the entire contents of the disclosure of which are hereby incorporated by reference.

FIGS. 4a–4d represent views of the device at various stages of an embodiment of a method according to the present invention that includes steps for causing the oxide portions to be self-aligning. Between the stages illustrated in FIGS. 4c and 4d, a gate may be formed utilizing a Damascene process.

Figure 3A:
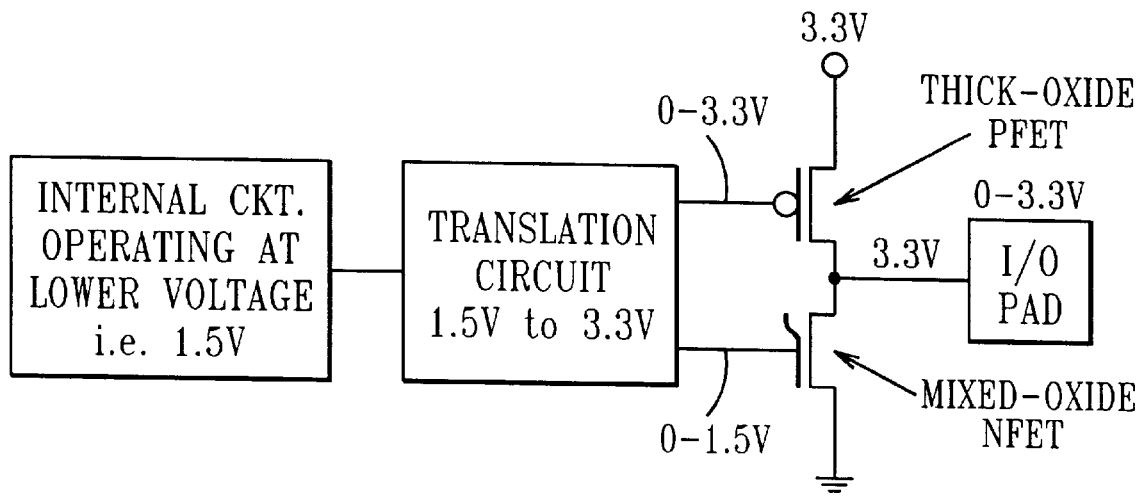
Figure 3B:
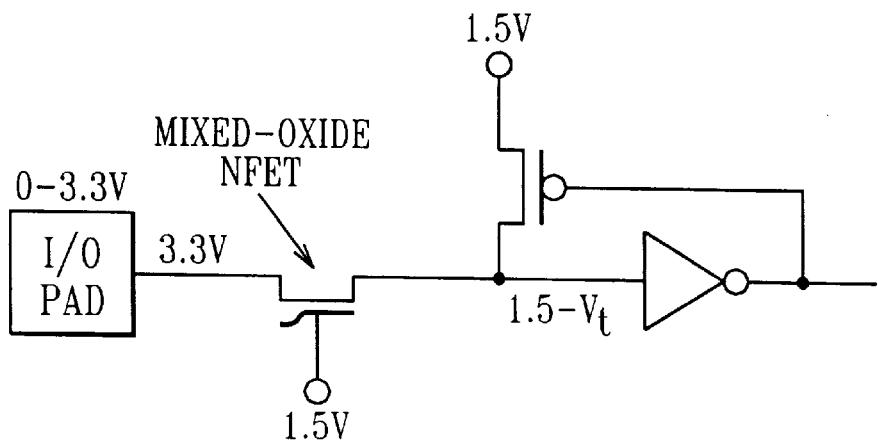
Figure 4A:
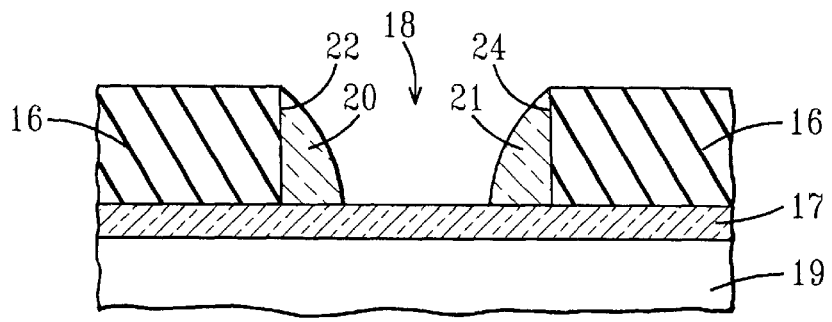
FIGS. 4a–4d represent various stages in an embodiment of a process according to the present invention.
Figure 4B:
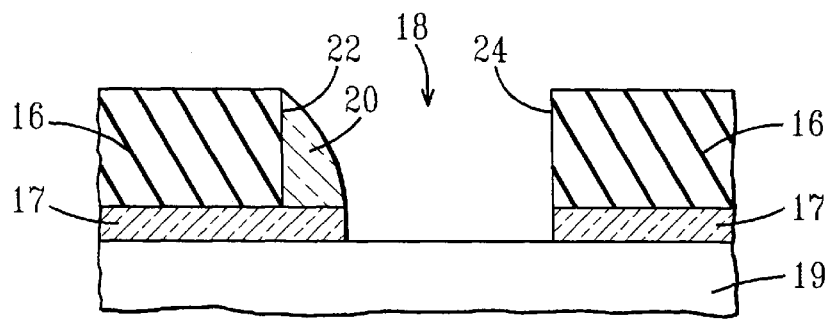
Figure 4C:
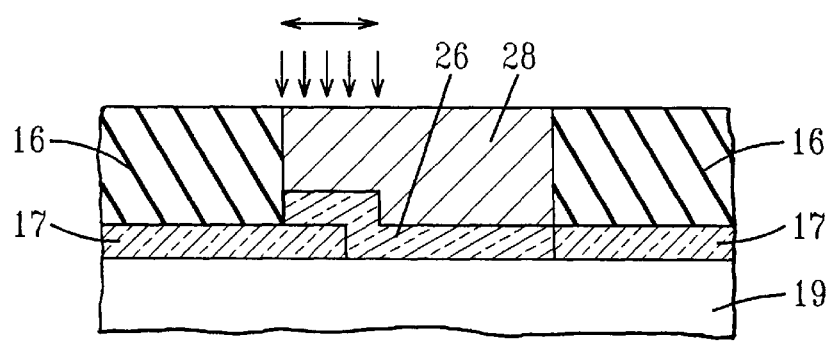
Figure 4D:
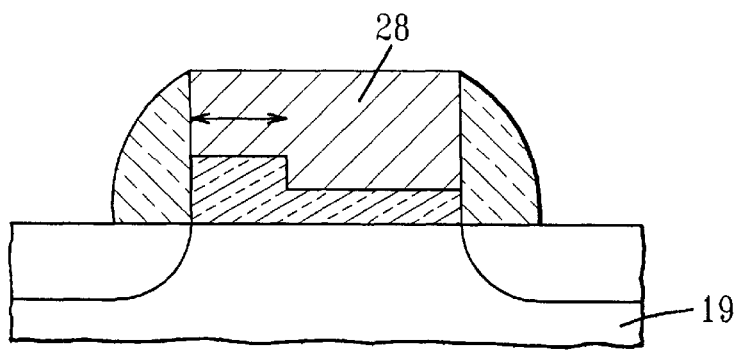

FIGS. 3a and 3b illustrate examples of applications that the structure according to the present invention may be utilized with. According to the operation of the present invention, for a driver, as illustrated in FIG. 3a, when the NFET gate is low, that is, when the device is off, the thicker gate oxide can withstand a high voltage of about 3.3 V across the drain to the gate. On the other hand, for the receiver, illustrated in FIG. 3b, when the input is high, at about 3.3 V, the thick oxide at the drain will be able to handle the high voltage.

As illustrated in FIGS. 3a and 3b, driver and receiver circuits that include a mixed thickness oxide FET according to the present invention. The circuits may also include a thick oxide FET, such as a PFET. Additionally, driver and receiver circuits that include a mixed thickness oxide FET structure according to the present invention may also include an input/output pad. As shown in FIG. 3a, the circuits may include a circuit that operates at a lower voltage, thus illustrating a circuit design necessitating a structure according to the present invention.

Advantages of the gate oxide structure according to the present invention include faster switching time, lower threshold voltage as compared to thick oxide, and meeting with oxide voltage requirements. The asymmetric gate oxide thickness may also make the either the source or the drain able to interface with a higher voltage than the other of the source and the drain.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for forming a semiconductor device, the method comprising the steps of:
    providing a substrate;
    forming a first electrically insulating layer on the substrate;
    forming a second electrically insulating layer on the first electrically insulating layer;
    forming openings through the second electrically insulating layer down to the level of the first electrically insulating layer;
    forming spacers on opposing sidewalls of the openings;
    removing spacers on one of the opposing side walls of the openings, thereby exposing portions of the first electrically insulating layer;
    removing exposed portions of the first electrically insulating layer in the openings, thereby exposing portions of the substrate;
    removing spacers on another of the opposing sidewalls of the openings, thereby exposing portions of the first electrically insulating layer; and
    forming a third electrically insulating layer in the openings over the exposed portions of the first electrically insulating layer and the exposed portions of the substrate.

2. The method according to claim 1, further comprising the steps of:
    forming an electrically conducting layer on portions of the third electrically insulating layer disposed in the openings;
    removing the second electrically insulating layer;
    forming source and drain regions in the substrate partially beneath the electrically conducting layer; and
    disposing electrically insulating material adjacent sidewalls of the conductor layer.

3. The method according to claim 2, further comprising the step of:
    planarizing an upper surface of the electrically conducting layer.

4. The method according to claim 2, wherein the electrically conducting layer are formed to be laterally coextensive with the sidewalls of the openings.

* * * * *